(12) United States Patent
Tiew et al.

(10) Patent No.: US 7,511,527 B1
(45) Date of Patent: Mar. 31, 2009

(54) METHODS AND APPARATUS TO TEST POWER TRANSISTORS

(75) Inventors: Kee Chee Tiew, Richardson, TX (US); Brett Smith, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/021,931

(22) Filed: Jan. 29, 2008

(51) Int. Cl.
   *G01R 31/26* (2006.01)
(52) U.S. Cl. ............... 324/769; 324/763; 324/765
(58) Field of Classification Search ............ None
   See application file for complete search history.

(56) References Cited

U.S. PATENT DOCUMENTS

| | | | |
|---|---|---|---|
| 5,483,173 A | | 1/1996 | Pellegrini |
| 5,739,712 A | * | 4/1998 | Fujii ........................ 327/323 |
| 5,867,014 A | * | 2/1999 | Wrathall et al. ............ 323/316 |
| 6,603,326 B1 | | 8/2003 | Tse |
| 2006/0164117 A1 | * | 7/2006 | Sander ........................ 324/766 |

* cited by examiner

*Primary Examiner*—Minh N Tang
(74) *Attorney, Agent, or Firm*—William B. Kempler; Frederick J. Telecky, Jr.; Wade J. Brady, III

(57) ABSTRACT

Methods and apparatus to test power transistors of integrated circuits on a wafer are disclosed. An example method comprises measuring a drain-source on resistance of a first transistor, measuring a drain-source on resistance of a second transistor, computing a scaling ratio between the transistors based on the drain-source on resistances of the transistors, measuring a first current indicative of an over-current condition of the first transistor, and computing a second current of the second transistor based on the current of the second transistor and the scaling ratio.

20 Claims, 3 Drawing Sheets

METHODS AND APPARATUS TO TEST POWER TRANSISTORS

FIELD OF THE DISCLOSURE

The present disclosure relates generally to power transistors and, more particularly, to methods and apparatus to test power transistors.

BACKGROUND

In a process to manufacture integrated circuits on a wafer (e.g., a substrate such as silicon, etc.), individual devices and/or circuits of the wafer are measured at different stages of the manufacturing process via wafer level testing. Generally, the wafer level testing monitors manufacturing processes, identifies process problems, and so forth. The integrated circuits of a wafer are also measured to determine if the integrated circuits are functional and will be further processed (e.g., packaged, etc.). In some examples, the integrated circuits are measured for one or more performance characteristics (e.g., threshold voltage, etc.). The results of the wafer level tests are recorded in a file correlating device location to device characteristics (e.g., a wafermap) and, during assembly of packaged integrated circuits, an automated die picker reads the file and selects integrated circuits to be packaged based on the results of the wafer level tests.

In general, to perform wafer level testing, a wafer prober having one or more wafer probes contacts with the wafer. The wafer probes have tips with thin diameters (e.g., 38 microns, etc.) and, as a result, wafer probe tips are susceptible to damage. In some examples, the wafer probe tips are not able to handle large amounts of current due to their diameter and may become damaged as a result of large amount of current. As a result, testing of high power devices, which are tested with significant currents, at the wafer level is often impossible to do using a continuous wave signal. Often, pulsed signals with a very low duty cycle (e.g., 10%) are used to test high power devices at the wafer level.

DETAILED DESCRIPTION

Example methods and apparatus to test high power transistors are described herein. Although the example methods and apparatus described herein generally relate to high power transistors on wafer, the disclosure is not limited to such. On the contrary, the teachings of this disclosure may be applied in any device or system that would benefit from determining an over-current condition of a semiconductor device (e.g., a transistor, etc.).

Figure 1:
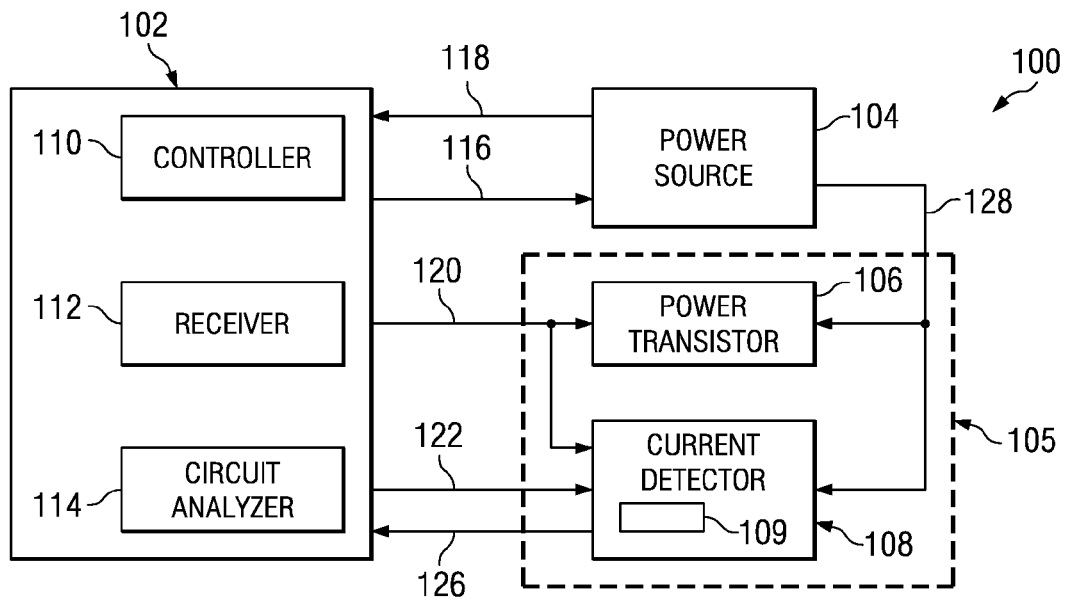
FIG. 1 illustrates a block diagram of an example test system to measure a transistor on a wafer.

FIG. 1 illustrates a block diagram of an example test system 100. The example test system 100 is configured to determine an over-current condition of a transistor, which may be associated with an integrated circuit (e.g., a power amplifier, etc.). In some examples, the over-current condition occurs when a current that exceeds a threshold current flows into a drain of the transistor. The threshold current is ideally a predetermined current that can flow from the drain to the source of the transistor without causing undesired effects, such as damaging the transistor, for example. In other words, the transistor is designed to have a current limit (i.e., a maximum current) substantially equal to the predetermined current. However, in semiconductor manufacturing, devices disposed in a wafer, such as the transistor, for example, vary across the wafer due to variations in processes and so forth. As a result, the devices of the wafer generally have substantially equal characteristics, however, the specifics of the device characteristics will deviate. In other words, not all devices on the wafer will have a threshold current substantially equal to the predetermined current. To determine the threshold current of an example power transistor, the example test system 100 includes a circuit tester 102, a power source 104, and a wafer 105.

In the illustrated example, the wafer 105 includes one or more integrated circuits disposed therein having a power transistor 106 and a current detector 108. In particular, the test circuit 108 may be disposed on the wafer 105 and may be activated by placing the integrated circuit into a testing mode. In the testing mode, one or more built-in test circuits, such as the test circuit 108, are coupled to the integrated circuit to test one or more devices of the integrated circuit. In the example of FIG. 1, the testing circuit 108 is implemented by a current detector 108 having a sense transistor 109 to test the power transistor 106 for one or more performance characteristics. In the illustrated example, the sense transistor 109 and the power transistor 106 are configured to have matching device characteristics, however, the sense transistor 109 is configured to be smaller (i.e., the sense transistor has a smaller drain current).

Generally, the power transistor 106 is configured to handle large amounts of current by, for example, switching on and off to allow current to conduct from its drain to its source. In such an example, the power transistor 106 is generally operated in the triode region, thereby preventing the power transistor 106 from consuming significant amounts of power. As a result, the power transistor 106 is capable of sinking large amounts of current (e.g., 10 amps) and it is difficult to operate the power transistor 106 in the saturation region. In addition, it is difficult to test the power transistor 106 due to the large currents that it is configured to sink.

The circuit tester 102 includes a controller 110, a receiver 112, and a circuit analyzer 114 to determine a threshold current of the power transistor 106 on the wafer 105 using the current detector 108 and the power source 104. In the illustrated example, the controller 110 conveys signals to control the devices of the example test system 100 such as, for example, the power source 104. The receiver 112 receives signals from the devices of the example test system 100 such as the current detector 108, for example. Using the signals from the receiver 112 and signals conveyed via the controller 110, the circuit analyzer 114 analyzes the power transistor 106 to determine a threshold current of the power transistor 106. In the illustrated example, the current detector 108 detects information indicative of the threshold current of the sense transistor 109 and the circuit tester 102 determines the threshold current of the power transistor 106 without directly testing the power transistor 106 for an over-current condition.

In the example of FIG. 1, the circuit tester 102 is coupled to the power source 104 via a line 116 to send signals to control the power source 104. The power source 104 conveys signals indicative of its operation (e.g., current, voltage, etc.) to the circuit tester 102 via a line 118. In particular, the circuit tester 102 causes the power source 104 to provide an amount of power (e.g., current, voltage, etc.) to the power transistor 106 and the power source 104 conveys signals indicative of its operation (e.g., current of the power source 104, etc.).

The circuit tester 102 is coupled to both the power transistor 106 and the current detector 108 via a line 120 to selectively actuate the power transistor 106 and the current detector 108 at different times. In the illustrated example, the circuit tester 102 is further coupled to the current detector 108 via a line 122 to prevent the circuit tester 102 from actuating the power transistor 106 and the current detector 108 at the same time. The current detector 108 is coupled to the circuit tester 102 via a line 126 to provide signals indicative of an over-current condition. The current detector 108 and the power transistor 106 are both coupled to the power source 104 to receive power (e.g., current, etc.) from the power source 104 via line 128.

In the illustrated example, the circuit analyzer 114 is configured to determine if the power transistor 106 meets one or more criteria indicative of a nominal device characteristic. One such device characteristic is the threshold current of the power transistor 106 that it can provide from its drain to its source without experiencing an over-current condition. In some examples, a current exceeding the threshold current causes the power transistor 106 to experience an over-current condition which can lead to undesired effects. For example, the over-current condition can overheat the power transistor 106. Due to the heat, the drain and source of the power transistor 106 fuse together, thereby destroying the power transistor 106. Of course, the power transistor 106 may experience any number of failure modes (e.g., electromigration, etc.)

In the example of FIG. 1, the circuit tester 102 determines the threshold current of the power transistor 106 by measuring the threshold current of the sense transistor 109 having substantially similar device characteristics. In one example, the circuit tester 102 computes a scaling ratio based on the drain-source on resistances of the power transistor 106 and the sense transistor 109. The circuit tester 102 then measures the threshold current of the sense transistor 109 by detecting a voltage across a sense resistor, for example. Using the threshold current of the sense transistor, circuit tester 102 computes a threshold current of the power transistor 106. That is, the circuit tester 102 determines the threshold current of the power transistor 106 without directly measuring the threshold current of the power transistor 106.

Figure 2:
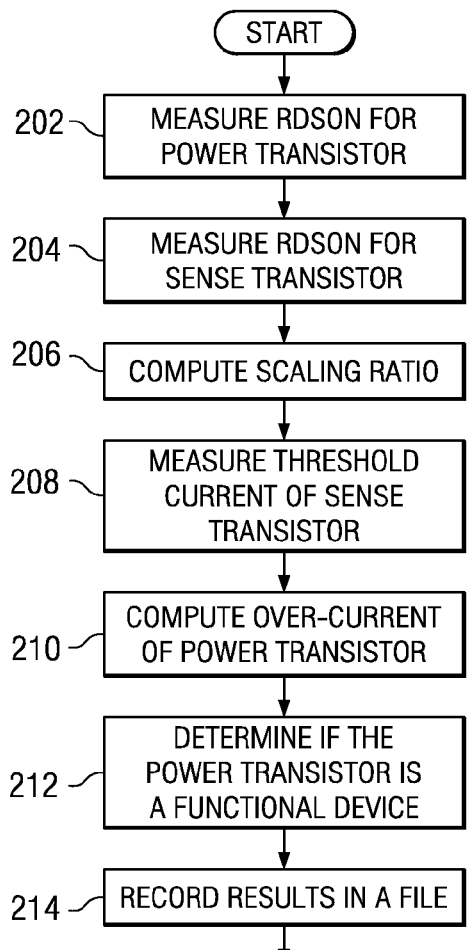
FIG. 2 is a flow chart representing a test process that may be carried out by the circuit tester of FIG. 1.

FIG. 2 illustrates an example process 200 to determine the threshold current of an example power transistor such as, for example, the power transistor 106. The example process 200 is generally performed on a wafer (e.g., silicon) to evaluate the devices contained therein at different stages of the semiconductor manufacturing process. However, the example process 200 may be implemented in any device and/or system, such as, for example, packaged integrated circuit testing. In other examples, the example process 200 may be implemented into test equipment to calibrate an example electronic system such as a cellular base station amplifier.

In addition, the example process 200 may be implemented by, for example, machine readable instructions that implement the circuit tester 102 of FIG. 1. Thus, at least some of the above described example process 200 may be implemented by one or more software and/or firmware programs running on a computer processor. However, dedicated hardware implementations including, but not limited to, application specific integrated circuits, programmable logic arrays and other hardware devices can likewise be constructed to implement some or all of the example process 200 described herein, either in whole or in part. In other examples, all or part of the example process 200 may be performed manually.

The example process 200 begins by measuring a drain-source on resistance $R_{DS\_ON}$ of the example power transistor (block 202). To measure the drain-source on resistance of the example power transistor, a voltage is applied to its gate to turn it on. At the same time, a predetermined current is provided to its drain. The drain-source voltage is measured and its drain-source on resistance is calculated by dividing the drain-source voltage by the predetermined current. Generally, to measure the drain-source on voltage of the power transistor, the current (e.g., 200 milliamperes) provided to the example power transistor does not have to saturate the power transistor (i.e., the power transistor 106 is in the triode region).

After measuring the drain-source on resistance of the example power transistor, the example process 200 measures the drain-source on resistance of a sense transistor such as the sense transistor 109, for example. To measure the drain-source on resistance, the example process 200 implements a method similar to the method used at block 202 (block 204) by configuring the sense transistor 109 in the triode region. In some examples, the example sense transistor is configured to have substantially similar device characteristics as the example power transistor (e.g., width-to-length ratio, doping profiles, etc.), however, the example sense transistor is configured to have a smaller channel and, therefore, has a smaller drain current. To allow the sense transistor to have substantially similar device characteristics, the sense transistor 109 may be placed adjacent to the power transistor 106 on the wafer 105, for example.

Using the drain-source on resistances, the example process 200 computes a scaling ratio by dividing the drain-source on resistance of the power transistor by the drain-source on resistance of the sense transistor (block 206). After the scaling ratio is computed, the example process 200 measures a threshold current of the example sense transistor by detecting a current substantially equal to the threshold current (block 208). As described above, a threshold current of the sense transistor is the current that can flow from the drain of the sense transistor to its source without causing undesired effects. To measure the threshold current, the example process 200 provides the sense transistor with a gate-source voltage and incrementally increases a drain current provided to a drain of the sense transistor until the drain current is substantially equal to the threshold current.

The example process 200 determines the when drain current of the sense transistor is substantially equal to the threshold current by detecting the current flowing through the sense transistor and monitoring the functionality of the sense transistor. In particular, the current flowing through the sense transistor is monitored until either the sense transistor fails or a current substantially equal to a threshold current flows through the sense transistor. Thus, to cause an over-current condition, the example process 200 incrementally increases the drain current at block 208 until it exceeds the threshold current and causes an over-current condition in the sense transistor.

When measuring the threshold current of the sense transistor, the sense transistor may be a faulty device and may become damaged due to the current flowing from its drain to its source. As a result, the gate and drain of the sense transistor may be shorted during the operation of the example process 200, thereby destroying the sense transistor. To ensure the sense transistor is still functional, the example process 200 may also selectively disable the sense transistor at block 208 to determine if the sense transistor is functional. In the event the example process 200 disables the sense transistor and current does not flow across the sense transistor, the sense transistor is functional. However, if the example process 200 disables the sense transistor and current does flow across the sense transistor, the sense transistor is no longer functional. In the event that the sense transistor is no longer functional, the example process 200 also determines that its threshold current has been reached.

After detecting the threshold current, the example process 200 determines a threshold current of the power transistor via the scaling ratio (block 210). In some examples, the threshold current of the power transistor is computed by multiplying the threshold current of the sense transistor by the scaling ratio. However, in other examples, other second-order effects of the power transistor may be incorporated into the computation (e.g., junction temperature, voltage threshold, etc.).

In the illustrated example, the example process 200 determines if the power transistor is a nominal device based on its threshold current (block 212). For example, if the threshold current exceeds a minimum current indicative of a nominal device (e.g., 5 amperes), the integrated circuit associated with the power transistor is determined to be a nominal device and the power transistor may be associated with further processes (e.g., packaging, testing, etc.). However, if the threshold current does not exceed the minimum current, the example process 200 determines the power transistor is not a nominal device and the power transistor may not be associated with further processes. The results of the example process 200 are recorded, for example, in a wafermap (block 214) correlating the test results to device locations. After recording the test results are recorded in the wafermap, the example process 200 ends.

Figure 3:
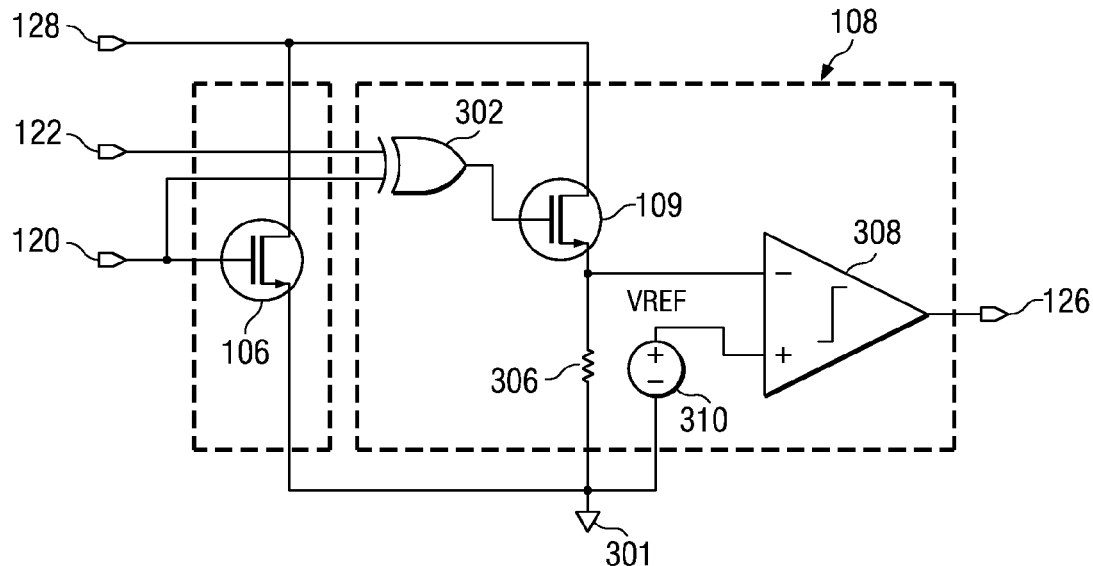
FIG. 3 is a schematic diagram of an example implementation of the current detector of FIG. 1.

FIG. 3 is a schematic of an example implementation of the current detector 108 of the example test system 100. As described above, the power transistor 106 and the current detector 108 are controlled by the operation of the circuit tester 102, which may be implemented by, for example, machine readable instructions that implement the example process 200. In the example of FIG. 3, the drain of the power transistor 106 is coupled to the power source 104 via line 128 and its gate receives a signal (e.g., a voltage) via the circuit tester 102 on line 120. The source of the power transistor 106 is coupled to a reference signal 301 such as, for example, ground.

The current detector 108 includes a switch 302 to selectively actuate the sense transistor 109 and a resistor 306 to generate a voltage. A drain of the sense transistor 109 is coupled to the power source 104 via line 128 and a source of the sense transistor 109 is coupled to the reference signal 301 via the resistor 306. In the illustrated example, the switch 302 is implemented by an exclusive OR gate 302 that the circuit tester 102 controls via lines 122 and 120. The output of the exclusive OR gate 302 is coupled to a gate of the sense transistor 109 to control its operation. As described above, the sense transistor 109 is configured to have matching device characteristics (e.g., doping, width-to-length ratio, etc.) as the power transistor 106, but is configured to have smaller drain and, thus, consumes less current than the power transistor 106.

The source of the sense transistor 109 is also coupled to an inverting input of a comparator 308. A reference voltage 310 (e.g., a bandgap voltage reference, etc.) is coupled to a non-inverting input of the comparator 308. The comparator 308 compares the voltages at its inputs and conveys a high voltage to the circuit tester 102 via line 126 if the voltage of the non-inverting input exceeds the voltage of the inverting input.

Similarly, the comparator 308 conveys a low voltage if the voltage at its inverting input exceeds the voltage at its non-inverting input. As described in more detail below, the comparator 308 conveys a high voltage if the current flowing into the drain of the sense transistor 109 exceeds its threshold current. Of course, the inverting and non-inverting terminals could be switched to get an output signal having an opposite sense.

The operation of the current detector 108 has different states of operation that will be explained in conjunction with the circuit tester 102 executing the example process 200. The example process 200 measures the drain-source on resistance of the power transistor 106 at block 202. To measure the drain source on resistance, the circuit tester 102 conveys a high voltage (e.g., 3.3 volts, 5 volts, etc.) via line 120 to turn on the power transistor 106. The circuit tester 102 also conveys a high voltage via line 122, causing the exclusive or gate 302 to convey a low voltage (e.g., zero volts) to the gate of the sense transistor 109, turning the sense transistor 109 off. The circuit tester 102 causes the power source 104 to convey a predetermined current via line 128, which is received by the drain of both the power transistor 106 and the sense transistor 109. However, because the sense transistor 109 is turned off, the power transistor 106 passes the current from its drain to its source.

The predetermined current causes the power transistor 106 to have a drain-source voltage based on its drain-source on resistance and the predetermined current. As a result, the voltage of the power source 104 is substantially equal to the drain-source voltage of the power transistor 106. The circuit tester 102 measures the drain-source voltage by receiving a signal indicative of the drain-source voltage of the power transistor 106. The circuit analyzer 114 of the circuit tester 102 then determines the drain-source on resistance of the power transistor 106 by dividing the measured voltage by the predetermined current.

After measuring the drain-source on resistance of the power transistor 106, at block 204, the example process 200 measures the drain-source resistance of the sense transistor 109. Thus, the circuit tester 102 conveys a low voltage via line 120 and a high voltage via line 122, causing the power transistor 106 to turn off due to the low voltage on line 120. At the same time, the high voltage on line 122 causes the exclusive OR gate 302 to convey a high voltage to the gate of the sense transistor 109, turning it on. The circuit tester 102 causes the power source 104 to convey a predetermined current via line 128, which is received by the drain of both the power transistor 106 and the sense transistor 109. However, because the power transistor 106 is turned off, the sense transistor 109 passes the current from its drain to its source.

As a result, the sense transistor 109 has a drain-source voltage based on the predetermined current, its drain-source on resistance, and the resistance of the resistor 306. The circuit tester 102 receives a signal indicative of the voltage of power source 104 via line 118. Because the resistance of the resistor 306 is known, the circuit analyzer 114 divides the voltage of the power source 104 by the predetermined current and then subtracts the resistance of the resistor 306 to determine the drain-source on resistance of the sense resistor 304.

After measuring the drain source on resistances, the circuit tester 102 computes the scaling ratio by, for example, dividing the drain-source on resistance of the power transistor 106 by the drain-source on resistance of the sense transistor 109. Once the scaling ratio is computed, the circuit tester 102 is configured to measure the threshold current of the sense transistor 109. To measure the threshold current of the sense transistor 109, the circuit tester 102 continues to convey a low voltage on line 120 to turn the power transistor 106 off. At the same time, the circuit tester 102 conveys a high voltage on line 122 to cause the exclusive OR gate 302 to convey a voltage to the sense transistor 109, turning it on.

The circuit tester 102 causes the power source 104 to convey a current, which is received by the drain of both the power transistor 106 and the sense transistor 109. However, because the power transistor 106 is turned off, the sense transistor 109 passes the current from its drain to its source. The current flows from the drain of the sense transistor 109 to its source, and then into the reference signal 301 via the resistor 306. As described above, the resistance value of the resistor 306 is affected by processes is not substantially uniform across the wafer 105. Rather, the resistors 306 of the wafer deviate in resistance value slightly, with some resistors 306 having significantly larger or smaller resistances.

As a result of the current across the resistor 306, the source of the sense transistor 109 has a voltage based on the current provided via the power source 104 and the resistance of the resistor 306. That is, the inverting input of the comparator 308 has the first voltage based on the current flowing from the source of the sense transistor 109 at its inverting input through the resistor 306. Thus, if the voltage across the resistor 306 exceeds the voltage of the voltage reference 310, the comparator 308 conveys a low voltage (e.g., 0 volts, etc.) to the circuit tester 102 via line 126.

As a result of low voltage from the comparator 308 (e.g., an indication than the threshold current has not been reached), the circuit tester 102 increases the current provided to the sense transistor 109 via the power source 104 by, for example, increasing its output voltage. In response to the increased current, the voltage at the source of the sense transistor 109 increases. In other examples, the circuit tester 102 may increase the voltage applied via line 122, causing the sense transistor 109 to sense transistor 109 to draw more current via the power source 104. However, if the voltage across the resistor 306 exceeds the voltage of the voltage reference 310, then the drain current of the sense transistor 109 is substantially equal to the threshold current of the sense transistor 109. As a result, the comparator 308 conveys a signal indicative of the threshold current to the circuit tester 102. In response, the circuit tester 102 stops the measurement and determines the threshold current of the sense transistor 109 by measuring the current provided via the power source 104.

After measuring the threshold current of the sense transistor 109, the circuit tester 102 computes a threshold current of the power transistor 106. In some examples, the circuit analyzer 114 of the circuit tester 102 computes the threshold current of the power transistor 106 by linearly scaling the threshold current of the sense transistor via the scaling ratio. However, in other example, other second-order effects are taken into account when computing its threshold current (e.g., junction temperature, threshold voltage, etc.). The results of the measurements and/or computations are recorded in, for example, a wafermap that is used by automated tools to manufacture packaged integrated circuits.

Figure 4:
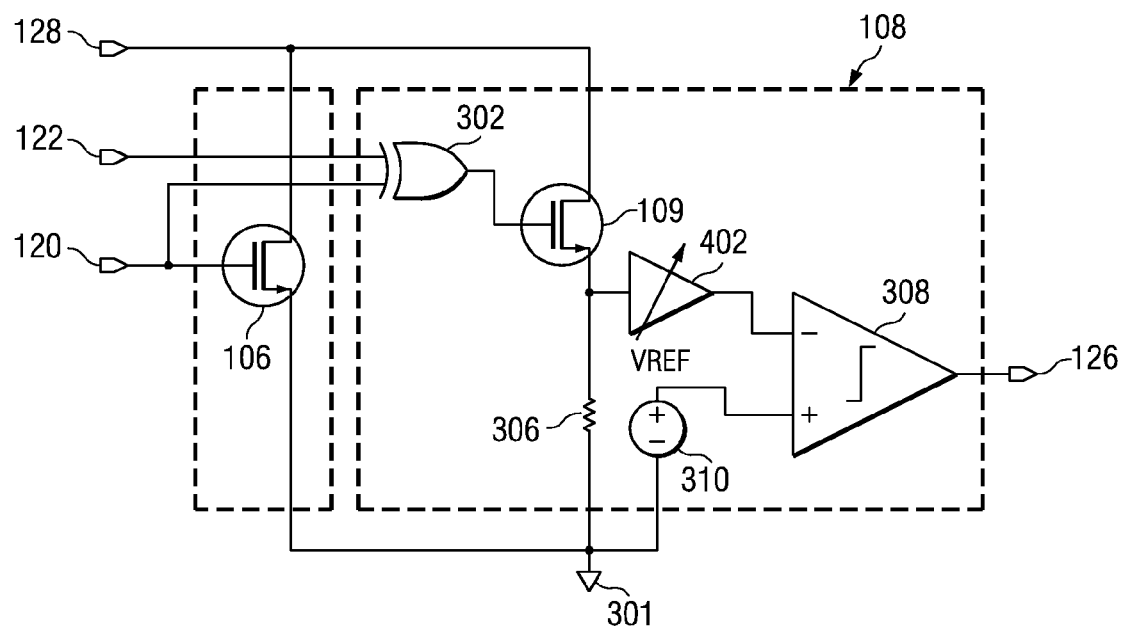
FIG. 4 is a schematic diagram of a second example implementation of the current detector of FIG. 1.

FIG. 4 is schematic diagram of another example current detector 108. In the example of FIG. 4, the current detector 108 includes a variable gain amplifier 402 that is coupled to the source of the sense transistor 109. The output of the variable gain amplifier 402 is coupled to the inverting input of the comparator 308. In the illustrated example, the variable gain amplifier 402 is configured to amplify the voltage at the source of the sense transistor 109, thereby allowing the current detector 108 to detect a smaller current flowing across the resistor 306. The variable gain amplifier 402 may be programmable by adjusting, for example, programmable trim bit settings based on the semiconductor processes.

Figure 5:
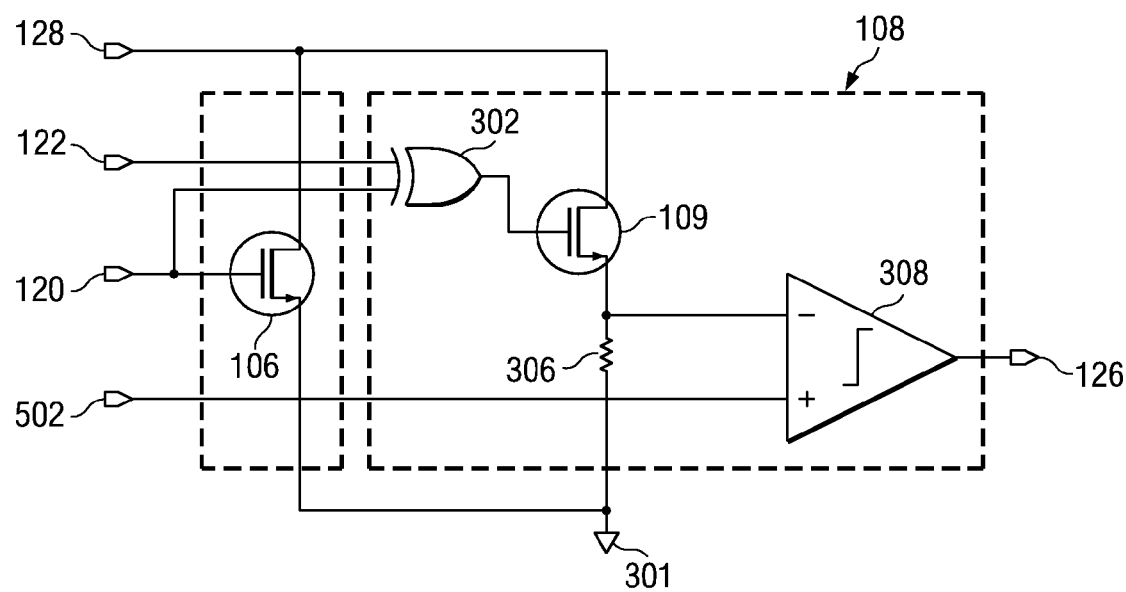
FIG. 5 is a schematic diagram of a third example implementation of the current detector of FIG. 1.

FIG. 5 is schematic diagram of yet a third example current detector 108. In the illustrated example, the current detector 108 receives an external voltage reference 502 via the inverting input of the comparator 308. The external voltage reference 502 may be based on a reference voltage to detect a threshold current of the sense transistor 109. In other examples, the external voltage reference 502 may be configured to detect the saturation current of the sense transistor 109. For example, the voltage reference 502 may be the voltage at the drain of the sense transistor 109 adjusted by a predetermined offset voltage (e.g. 0.2 volts, etc.). In such an example, when the drain-source voltage of the sense transistor 109 exceeds the predetermined offset voltage, the comparator 308 conveys a signal via line 126 indicative of a threshold current.

Methods, apparatus, and articles of manufacture to test high power transistors have been described. In the described examples, a current detector is implemented to measure a power transistor on a wafer without large amounts of current. In particular, a current detector having a sense transistor is measured to determine when the sense transistor is about to experience an over-current condition. The sense transistor and the power transistor have matching device characteristics to allow an accurate computation of a threshold current of the power transistor 106 to be made without directly measuring the power transistor 106, thereby preventing damage to the example test system and/or the high power transistor. The described example processes may be implemented with, for example, software tools designed to automate test equipment. In addition, the current detector is easy to implement at the wafer level and does not consume a significant amount of space on the wafer. In the illustrated examples, the current detector includes a transistor in the common drain configuration. However, the current detector may be implemented by any suitable transistor configuration such as the common source configuration, for example.

Although certain methods, systems, and articles of manufacture have been described herein, the scope of coverage of this patent is not limited thereto. To the contrary, this patent covers all methods, systems, and articles of manufacture fairly falling within the scope of the appended claims either literally or under the doctrine of equivalents.

What is claimed is:

1. A method of testing a power transistor of an integrated circuit on a wafer, comprising:
   measuring a drain-source on resistance of a first transistor;
   measuring a drain-source on resistance of a second transistor;
   computing a scaling ratio between the transistors based on the drain-source on resistances of the transistors;
   measuring a first current of the first transistor, the current being indicative of an over-current condition of the first transistor; and
   computing a second current of the second transistor based on the current of the second transistor and the scaling ratio.

2. A method as defined in claim 1, wherein measuring the current of the first transistor comprises:
   providing the first current to a drain of the first transistor and a first voltage to a gate of the first transistor;
   comparing a second voltage at a source of the first transistor to a third voltage indicative of the over-current condition; and
   increasing the current provided to the first transistor if the second voltage exceeds the third voltage.

3. A method as defined in claim 1, wherein the current is substantially continuous over a period of time.

4. A method as defined in claim 1, wherein computing the scaling ratio between the transistors comprises dividing the drain-source resistance of the second transistor by the drain-source resistance of the first transistor.

5. A method as defined in claim 1, wherein computing the second current of the second transistor comprises multiplying the first current of the first transistor by the scaling ratio.

6. A method as defined in claim 5, wherein computing the second current of the second transistor further comprises scaling the drain-source on resistance over a change in temperature.

7. A method as defined in claim 1, further comprising determining if the second transistor is to be packaged into a packaged integrated circuit.

8. A system to test a power transistor on a wafer, comprising:
    a circuit tester coupled to a power source to receive instructions from the circuit tester;
    a first transistor to turn on in response to an instruction from the circuit tester, a drain of the first transistor being coupled to the power source; and
    a current detector to turn on in response to an instruction from the circuit tester, wherein the current detector is to communicate a signal indicative of an over-current condition of the first transistor to the circuit tester.

9. A system as defined in claim 8, wherein the current detector comprises a switch to selectively couple the circuit tester to a second transistor, the second transistor having a drain coupled to the power source and a source coupled to ground via a resistor.

10. A system as defined in claim 9, wherein the current detector further comprises a comparator coupled to the source of the second transistor to detect an over-current condition of the second transistor.

11. A system as defined in claim 10, wherein the circuit tester is to determine a threshold current indicative of the over-current condition of the second transistor.

12. A system as defined in claim 11, wherein the circuit tester is to measure the drain-source on resistance of the first transistor and the drain-source on resistance of the second transistor.

13. A system as defined in claim 12, wherein the circuit tester is to compute a scaling factor based on the drain-source on resistances of the first and second transistors.

14. A system as defined in claim 13, wherein the circuit tester is to calculate a threshold current of the first transistor based on the threshold current of the second transistor and the scaling ratio, the threshold current being indicative of an over-current condition of the first transistor.

15. An article of manufacture storing machine readable instructions which, when executed, cause a machine to:
    measure a drain-source on resistance of a first transistor;
    measure a drain-source on resistance of a second transistor;
    compute a scaling ratio between the transistors based on the drain-source on resistances of the transistors;
    measure a first current of the first transistor, the current being indicative of an over-current condition of the first transistor; and
    compute a second current of the second transistor based on the current of the second transistor and the scaling ratio.

16. An article of manufacture as defined in claim 15, wherein measuring the current of the first transistor comprises:
    provide the first current to a drain of the first transistor and a first voltage to a gate of the first transistor;
    compare a second voltage at a source of the first transistor to a third voltage indicative of the over-current condition; and
    increase the current provided to the first transistor if the second voltage exceeds the third voltage.

17. An article of manufacture as defined in claim 15, wherein the current is substantially continuous over a period of time.

18. An article of manufacture as defined in claim 15, wherein computing the scaling ratio between the transistors comprises dividing the drain-source resistance of the second transistor by the drain-source resistance of the first transistor.

19. An article of manufacture as defined in claim 15, wherein computing the second current of the second transistor comprises multiplying the first current of the first transistor by the scaling ratio.

20. An article of manufacture as defined in claim 19, wherein computing the second current of the second transistor further comprises scaling the drain-source on resistance over a change in temperature.

* * * * *